(12) United States Patent
Kwok et al.

(10) Patent No.: US 10,839,916 B2
(45) Date of Patent: Nov. 17, 2020

(54) ONE-SIDED SOFT READS

(71) Applicant: Intel Corporation, Santa Clara, CA (US)

(72) Inventors: Zion S. Kwok, Burnaby (CA); Pranav Kalavade, San Jose, CA (US); Ravi H. Motwani, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 67 days.

(21) Appl. No.: 15/948,556

(22) Filed: Apr. 9, 2018

(65) Prior Publication Data

US 2019/0043589 A1 Feb. 7, 2019

(51) Int. Cl.

| | | |
|---|---|---|
| *G11C 29/00* | (2006.01) | |
| *G11C 16/26* | (2006.01) | |
| *G11C 16/04* | (2006.01) | |
| *G11C 29/52* | (2006.01) | |
| *G06F 11/10* | (2006.01) | |
| *G11C 11/56* | (2006.01) | |
| *G11C 29/02* | (2006.01) | |
| *G11C 29/04* | (2006.01) | |

(52) U.S. Cl.
CPC .......... *G11C 16/26* (2013.01); *G06F 11/1072* (2013.01); *G11C 11/5642* (2013.01); *G11C 16/0483* (2013.01); *G11C 29/52* (2013.01); *G11C 29/021* (2013.01); *G11C 29/028* (2013.01); *G11C 2029/0409* (2013.01); *G11C 2029/0411* (2013.01)

(58) Field of Classification Search
None
See application file for complete search history.

(56) References Cited

U.S. PATENT DOCUMENTS 10,163,500 B1 * 12/2018 Yu .................... G11C 11/5642
2014/0108879 A1 * 4/2014 Hirth ................... H03M 13/015
714/751

(Continued)

OTHER PUBLICATIONS

Ashok K. Sharma, "Advanced Nonvolatile Memory Designs and Technologies," in Advanced Semiconductor Memories: Architectures, Designs, and Applications , IEEE, 2003, pp. 319-477, doi: 10.1109/9780470544136.ch5. (Year: 2003).*

*Primary Examiner* — Daniel F. McMahon
(74) *Attorney, Agent, or Firm* — Compass IP Law, PC

(57) ABSTRACT

One-sided soft reads can enable improved error-correction over regular reads without significantly increasing the latency for reads. In one example, a flash storage device includes an array of storage cells and a controller to access the array of storage cells. The controller is to perform at least one read of a storage cell to cause a read strobe to be applied at an expected read reference voltage and also cause one or more additional read strobes to be applied at voltages on only one side of the expected read reference voltage (e.g., which in some cases involves applying the additional one or more read strobes at a voltage with a slightly lower or higher magnitude than the magnitude of the expected read reference voltage). The controller can then provide a logic value and one or more bits indicating confidence or reliability of the logic value's accuracy based on an electrical response of the storage cell to the read strobe and the one or more additional read strobes.

17 Claims, 6 Drawing Sheets

(56) References Cited

U.S. PATENT DOCUMENTS

| | | | |
|---|---|---|---|
| 2014/0362646 A1* | 12/2014 | Sharon | G11C 11/5642 365/185.17 |
| 2015/0149818 A1* | 5/2015 | Kalavade | G06F 11/073 714/6.13 |
| 2018/0081542 A1* | 3/2018 | Shirakawa | G06F 11/1068 |
| 2019/0080747 A1* | 3/2019 | Sakurada | G11C 11/419 |

* cited by examiner

300

```
┌─────────────────────────────────────────────┐
│ APPLY A READ STROBE TO A STORAGE CELL OF A FLASH │
│ STORAGE DEVICE AT AN EXPECTED READ REFERENCE │
│                   VOLTAGE                   │
│                     302                     │
└─────────────────────────────────────────────┘
                      │
                      ▼
┌─────────────────────────────────────────────┐
│ APPLY ONE OR MORE ADDITIONAL READ STROBES AT │
│ VOLTAGES ON ONLY ONE SIDE OF THE EXPECTED READ │
│              REFERENCE VOLTAGE              │
│                     304                     │
└─────────────────────────────────────────────┘
                      │
                      ▼
┌─────────────────────────────────────────────┐
│ PROVIDE A LOGIC VALUE AND ONE OR MORE BITS INDICATING │
│ RELIABILITY BASED ON AN ELECTRICAL RESPONSE OF THE │
│ STORAGE CELL TO THE READ STROBE AND THE ONE OR MORE │
│              ADDITIONAL READS              │
│                     306                     │
└─────────────────────────────────────────────┘
```

ONE-SIDED SOFT READS

FIELD

The descriptions are generally related to memory and storage devices such as flash memory, and more particular descriptions are related to techniques for performing reads of flash memory.

BACKGROUND

There is a trend for systems across the mobile, client, and enterprise segments to use flash memory for storage (e.g., such as solid state drives (SSDs)). Flash storage, such as NAND flash memory is a nonvolatile storage medium. Nonvolatile storage refers to a storage having a state that is determinate even if power is interrupted to the device. Like volatile storage, reads to nonvolatile storage can result in errors. Although flash storage devices typically implement techniques to detect and correct errors, not all errors are correctable, and error correction techniques typically add latency to read operations.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" or "examples" are to be understood as describing a particular feature, structure, and/or characteristic included in at least one implementation of the invention. Thus, phrases such as "in one embodiment" or "in one example" appearing herein describe various embodiments and implementations of the invention, and do not necessarily all refer to the same embodiment. However, they are also not necessarily mutually exclusive.

FIG. 3 is a flow chart illustrating an example of a method of performing a one-sided soft read.

Descriptions of certain details and implementations follow, including a description of the figures, which may depict some or all of the embodiments described below, as well as discussing other potential embodiments or implementations of the inventive concepts presented herein.

DETAILED DESCRIPTION

One-sided soft reads are described herein. In one example, a one-sided soft read involves applying one or more additional read strobes either above or below an expected reference read voltage. The additional read strobes applied to one side of the expected read reference voltage can result in information regarding the reliability of the value read (sometimes referred to as "soft information").

A read operation for accessing data stored in a flash storage device typically involves applying one or more read voltages to a storage cell to see if the cell conducts current at the applied voltage(s). For a flash storage cell that can store multiple bits in a single cell, read voltages at multiple levels (sometimes referred to as read strobes or read pulses) are applied to the cell. The stored value can then be determined based on whether the cell conducts current at different read voltages. If the applied read voltage is above the threshold voltage (e.g., above the threshold voltage for the level that the cell is programmed to), the cell will conduct current. If the applied read voltage is below the threshold voltage, the cell will not conduct current.

Figure 1:
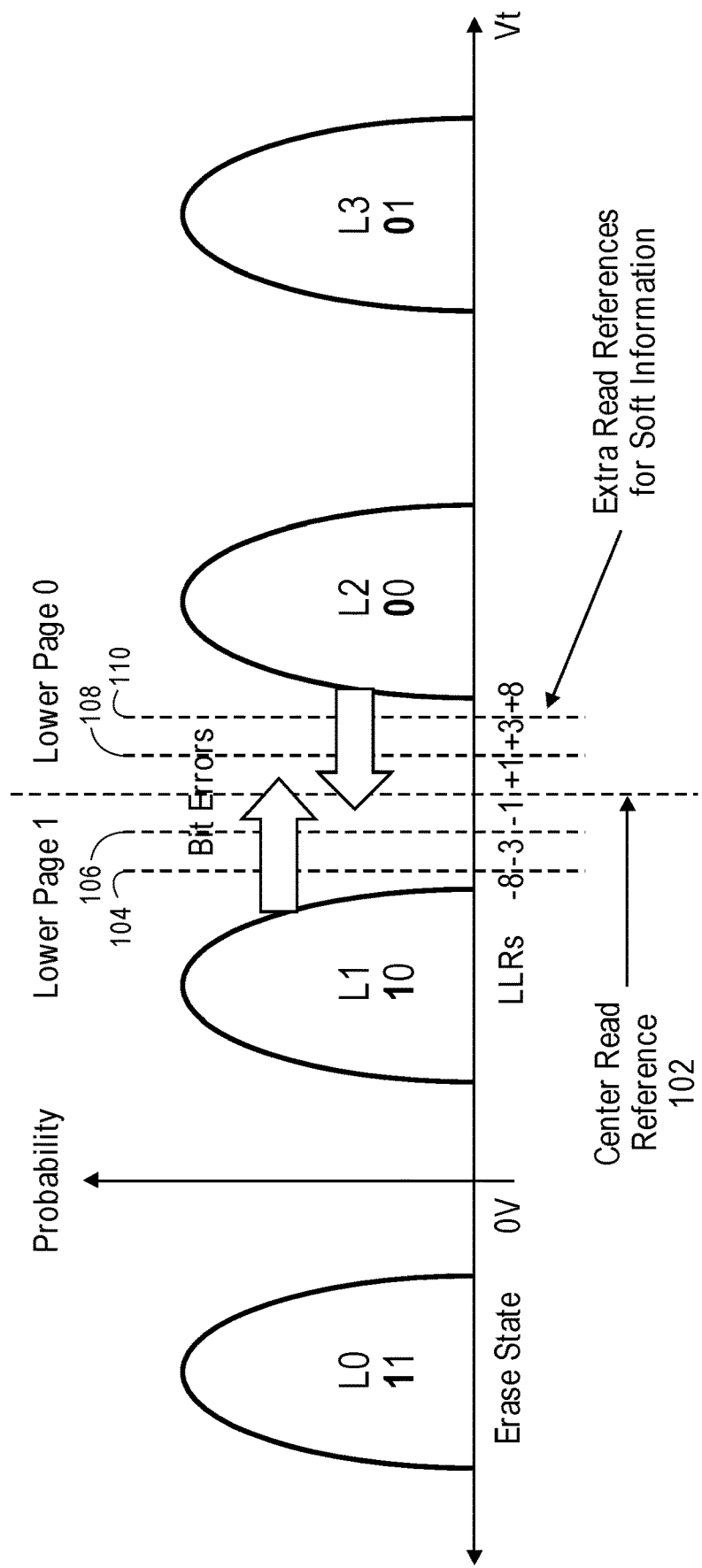
FIG. 1 illustrates an example of voltage probability distributions for a multi-level flash storage cell.

FIG. 1 illustrates an example of voltage probability distributions for a multi-level flash storage cell. The x-axis is the threshold voltage and the y-axis is probability. In one example, NAND memory works by storing differing numbers of electrons in a floating gate of a flash memory cell or transistor. The electrons affect the minimum voltage that needs to be applied at the control gate of the flash transistor to enable current to flow through the transistor. The minimum voltage is known as the threshold voltage, or VT. A NAND flash memory chip may have billions of flash transistors, and they are typically programmed to either 2 different levels to store 1 bit per cell (SLC), 4 different levels to store 2 bits per cell (MLC), 8 different levels to store 3 bits per cell (TLC), or 16 different levels to store 4 bits per cell. When the NAND flash memory is read, a read reference voltage is applied to the control gates along one or more wordlines. The read reference voltage is chosen so that it falls between two different levels. In some cases, if current flows through the transistor, it is detected as a logic-1, and if current does not flow, it is detected as a logic-0. In other cases, logic-0 and logic-1 are reversed.

In the example illustrated in FIG. 1, there are four levels that a cell can be at: L0, L1, L2, and L3. The levels L0-L3 correspond to different 2-bit logic-values. In the illustrated example, L0 corresponds to '11', L1 correspond to '10', L2 corresponds to '00', and L3 corresponds to '01', however, different conventions can be adopted that assign different logic values to the different levels. Cells that are at L0 will typically exhibit the threshold voltage distribution shown at L0, and cells that are programmed to be at L1, L2, or L3 will typically exhibit higher threshold voltage distributions as shown in FIG. 1.

Traditionally, a single read strobe at a read reference voltage would be applied between levels of a multi-level storage cell. For example, as illustrated in FIG. 1, a center read reference voltage 102 is applied between L1 and L2 in order to determine whether the lower page is a 0 or a 1. Read reference voltages are typically selected to fall in between the expected threshold voltages. For example, as illustrated in FIG. 1, the read reference voltage 102 has a magnitude between the expected threshold voltages for L1 and L2. In one such example, similar read reference voltages would be applied between the expected threshold voltage of L0 and L1, and between the expected threshold voltages of L2 and L3. In this example, if a strobe at the read reference voltage 102 causes the cell to conduct current, it can be determined that the lower page is a logic-1 (because the lower page of L0 and L1 is a logic-1), and if the cell does not conduct current, it can be determined that the lower page of the cell is a logic-0 (because the lower page of L2 and L3 is a logic-0).

However, the threshold voltages are not always within the expected distributions. Since the VT for a flash transistor cannot be programmed exactly and there are effects such as read disturb, write disturb, program disturb that cause the VT to increase or decrease. This causes some transistors to be on the wrong side of the read reference voltage, causing it to be read as the wrong logical bit value. Referring to the distributions of FIG. 1, the threshold voltage distributions can have tails that approach one another or overlap. For example, a cell programmed to be at L1 can have a threshold voltage that is closer to or overlapping with the L0 or L2 threshold voltage distributions. In such cases, the result of a read strobe may be incorrect.

Many of the bit errors involve flash cells that have a $V_T$ that is just above or below the read reference voltage. Therefore, one technique to improve the reliability of read operations is to perform soft reads. A "soft read" typically involves the application of one or more additional read strobes to a cell on both sides of the read reference voltages at voltages that are just a little higher and lower than the read reference voltage. For example, FIG. 1 illustrates additional read strobes at voltages 104, 106, 108, and 110 in addition to a strobe at the read reference voltage 102.

In the example illustrated in FIG. 1, a log-likelihood ratio (LLR) is shown for the voltage of each extra read strobe. Typically, normal Gaussian distributions are assumed based on test data, and then the LLRs can be computed. The read reference voltages can delineate "bins" or "zones" where the threshold voltage may lie (in the range between the highest voltage where current conducted and below the lowest voltage where the current did not conduct). For these bins, LLR values can be assigned based on assumptions about normal Gaussian distributions expected based on test data. In the illustrated example, the LLR is determined by taking the log of a ratio given by the probability at a threshold voltage of reading a logic-0 when the programmed value was actually a logic-0, divided by the probability that the programmed value was a logic-1. Thus, if the probability that the page value is logic-0 is higher than the probability that the page value is logic-1, the LLR is positive and if the probability that the page value is logic-1 is higher, then the LLR is negative. In this example, the absolute values of the LLR are not necessarily meaningful (e.g., the numbers can be scaled), however, the LLRs at different voltages relative to one another can provide information helpful for error correction. LLRs are typically used with LDPC codes. However, one-sided soft reads can be used with LDPC as well as other types of codes, such as convolutional codes with a Viterbi decoder. By performing reads slightly higher and lower than the expected read reference voltage, it can be determined if the threshold voltage is close to the boundary (e.g., close to overlapping with the distribution for another level). If the threshold voltage is close to the boundary, the bit may be unreliable (e.g., an error).

Thus, in addition to the logic-value determined by performing a read at the expected read reference voltage, a soft read can also provide "soft information" that indicates how reliable the value is, which can in turn be used for stronger ECC (error correction code) correction. However, soft reads increase the latency of read operations. Soft reads typically have at least 3 times as many read strobes as regular reads. For multi-level flash cells, even more read strobes are required for the regular reads than in single-level flash cells, which results in an even greater number of read strobes for soft reads. Therefore, soft reads of multi-level flash cells (such as triple-level cells (TLC) or quad-level cells (QLC)) result in significantly higher latencies than regular reads.

Figure 2A:
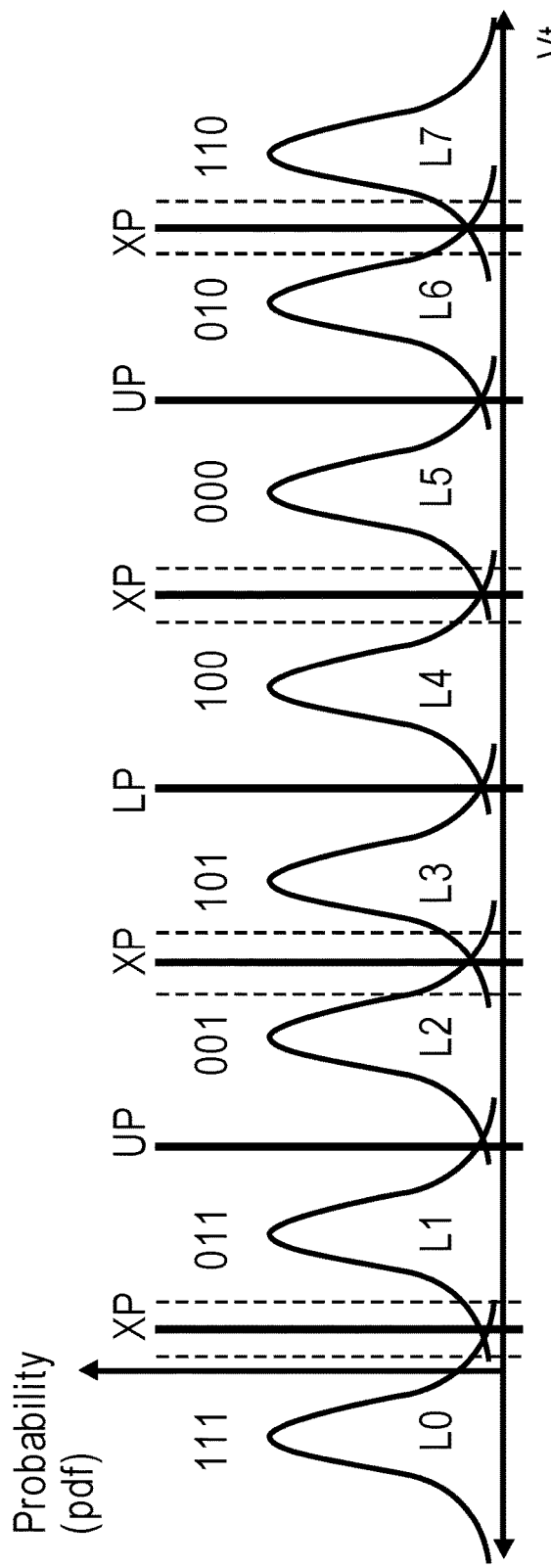
FIGS. 2A and 2B illustrate examples of a traditional soft read and a one-sided soft read, respectively.
Figure 2B:
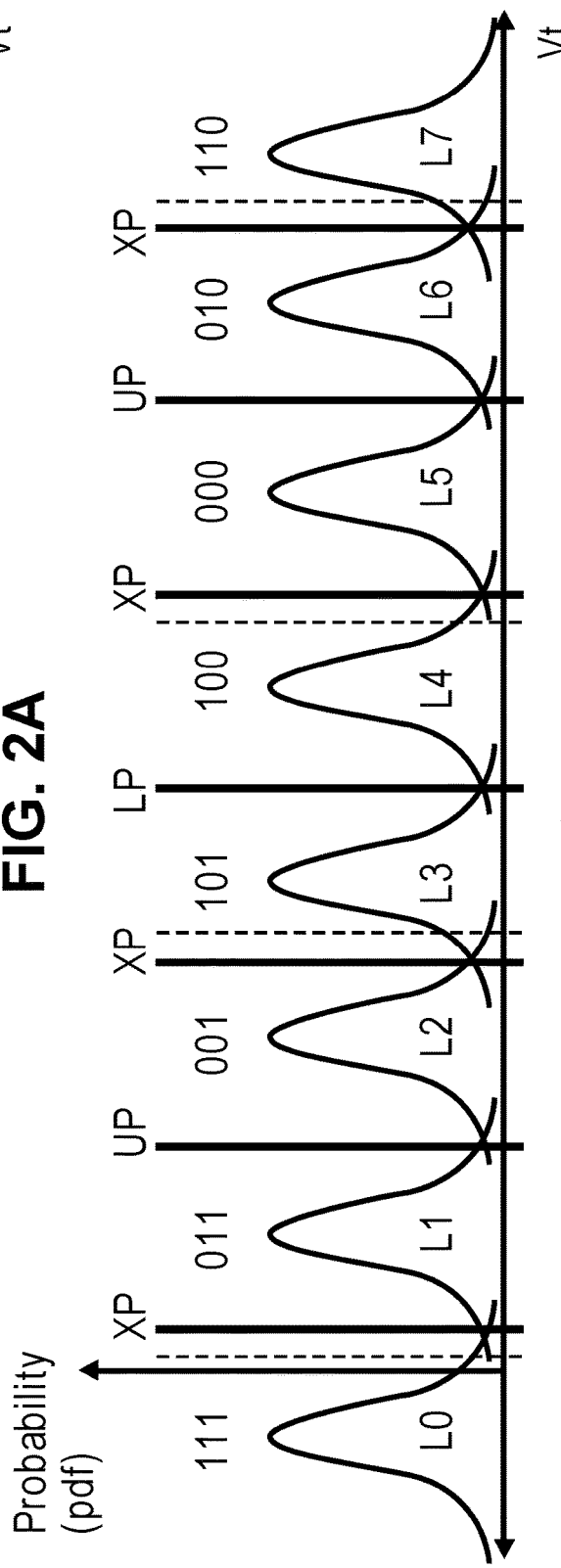

In contrast, a one-sided soft read can result in improved error correction without increasing read latencies as much as traditional soft reads. FIGS. 2A and 2B illustrate examples of a traditional soft read and a one-sided soft read, respectively. FIG. 2A illustrates an example of a traditional soft read for a triple-level cell. In FIGS. 2A and 2B, there are eight threshold voltage distributions illustrated corresponding to eight different levels (L0-L7). Therefore, FIGS. 2A and 2B also illustrate seven read strobes (illustrated by the solid lines between the threshold voltage distributions. FIG. 2A also shows soft reads on both sides of the expected read reference voltage for the XP (extra page) read strobes. Note that although the soft reads are shown only for the XP (extra page) reads, soft reads can be performed between all the levels (e.g., soft reads strobes can also be applied for the upper page (UP) and lower page (LP) reads). Thus, in the illustrated example, there are an additional 8 read strobes applied to perform the soft read. Specifically, the FIG. 2A illustrates an additional read both above and below each of the expected read reference voltages for the XP reads.

In contrast, FIG. 2B illustrates an example of a one-sided soft read. As can be seen in FIG. 2B, an additional read strobe is only applied to one side of the expected read reference voltage for the XP reads. Therefore, there are half as many additional read strobes (four additional read strobes for the one-sided soft read compared to eight additional read strobes for the regular soft read illustrated in FIG. 2B). Note that although FIG. 2B illustrates additional read strobes only for the XP reads, additional read strobes can be applied for the UP and LP reads instead of, or in addition to, the XP reads. However, in the illustrated example, there are a larger number of read strobes applied in order to read the extra page (4 strobes) than to read the lower and upper page (1 strobe for the lower page and 2 strobes for the upper page). Therefore, a one-sided soft read results in a significant reduction in read strobes when applied for the XP reads, in the illustrated example.

As can be seen in FIG. 2B, an additional read strobe for a one-sided soft read is not always applied to the same side of the expected read reference voltage. For example, for some levels, an additional read strobe is applied at a magnitude that is lower than the magnitude of the expected read reference voltage, and for other levels, an additional read strobe is applied at a magnitude that is higher than the magnitude of the expected read reference voltage. In one example, whether the additional read strobes are applied above or below the expected read reference voltage is based on soft read error patterns. Soft read error patterns can include scenarios in which threshold voltages are increasing in magnitude or decreasing in magnitude. Another soft read error pattern can include zeros going to ones or ones going to zeros. For example, there can be a tendency for logic ones that are written to be read back as logic zeros, or vice versa. Thus, in one such example, logic in a controller (e.g., a flash storage controller) determines whether it is more likely that a bit has a zero-to-one error or a one-to-zero error, and only performs the extra read strobe on one side of the expected read reference voltage.

In one example, if there are more one-to-zero errors, the additional read is performed on the side of the expected read reference voltage closest to a level indicating a logic zero. If there are more zero-to-one errors, the additional read is performed on the side of the expected read reference voltage closest to a level indicating a logic one. FIG. 2B illustrates one such example in which it was determined that there is more likely to be a zero-to-one error. For example, referring to FIG. 2B, the extra page reads determine the least significant bit (bit 0). If a cell conducts current in response to a read strobe between L0 and L1, then the least significant bit is a logic-1, and if the cell does not conduct current, the least significant bit is a logic-0. Therefore, for a read strobe between L0 and L1, the "side" of the expected reference voltage that is closest to a logic-1 is below the expected reference voltage (i.e., a voltage with a lower magnitude than the expected read reference voltage). Note that in some cases the expected read reference voltage and an additional read strobe could be at voltages with different polarities. For example, referring to FIG. 2B, the expected read reference voltage between L0 and L1 is shown as a positive voltage, but an additional read strobe between L0 and L1 on the side of the expected read reference voltage closest to a logic-1 could be a negative voltage. Thus, in such cases it is possible for the magnitude of an additional read strobe "below" the expected read reference voltage to be lower, the same, or even higher than the magnitude of the expected read reference voltage. However, in the example illustrated in FIG. 2B, the additional read strobe voltage and the expected read reference voltage have the same polarity, and therefore the magnitude of the additional read strobe is lower than the magnitude of the expected read reference voltage.

In contrast, an additional read strobe between L2 and L3 is above the expected reference voltage (i.e., a voltage with a higher magnitude than the expected read reference voltage). This is because, in the illustrated example, if a cell conducts current in response to an applied read strobe between L2 and L3, then the lowest bit is a logic-0, and if the cell does not conduct current then the lowest bit is a logic-1. Therefore, for a read strobe between L2 and L3, the side of the expected reference voltage that is closest to a logic-1 is above the expected reference voltage. Thus, in the example illustrated in FIG. 2B, if there are more likely to be zero-to-one errors, the additional read strobes between L0 and L1 and between L4 and L5 have a lower magnitude than the expected read reference voltages at those levels, and additional read strobes between L2 and L3 and between L6 and L7 have a higher magnitude than the expected read reference voltages at those levels. Accordingly, additional read strobes can be applied to only one side of an expected read reference voltage. Furthermore, whether the additional strobes have a higher or lower magnitude than the expected read reference voltage at a given level can be based on error information, such as whether more zero-to-one or one-to-zero errors are predicted. Due to fewer read strobes, a one-sided soft read can result in lower latency than a regular soft read, while at the same time providing reliability information to improve error correction.

As will be understood by those having skill in the art, the techniques described in this disclosure apply to both single-level and multi-level cells. Furthermore, the logic values assigned to each level can be different than the examples discussed in this disclosure. Additionally, although a single one-sided read strobe is shown in FIG. 2B for XP reads, in other examples, multiple soft reads can be performed on one side of the read reference voltage (e.g., one, two, three, or more soft reads can be performed on one side of the read reference voltage.

Figure 2C:
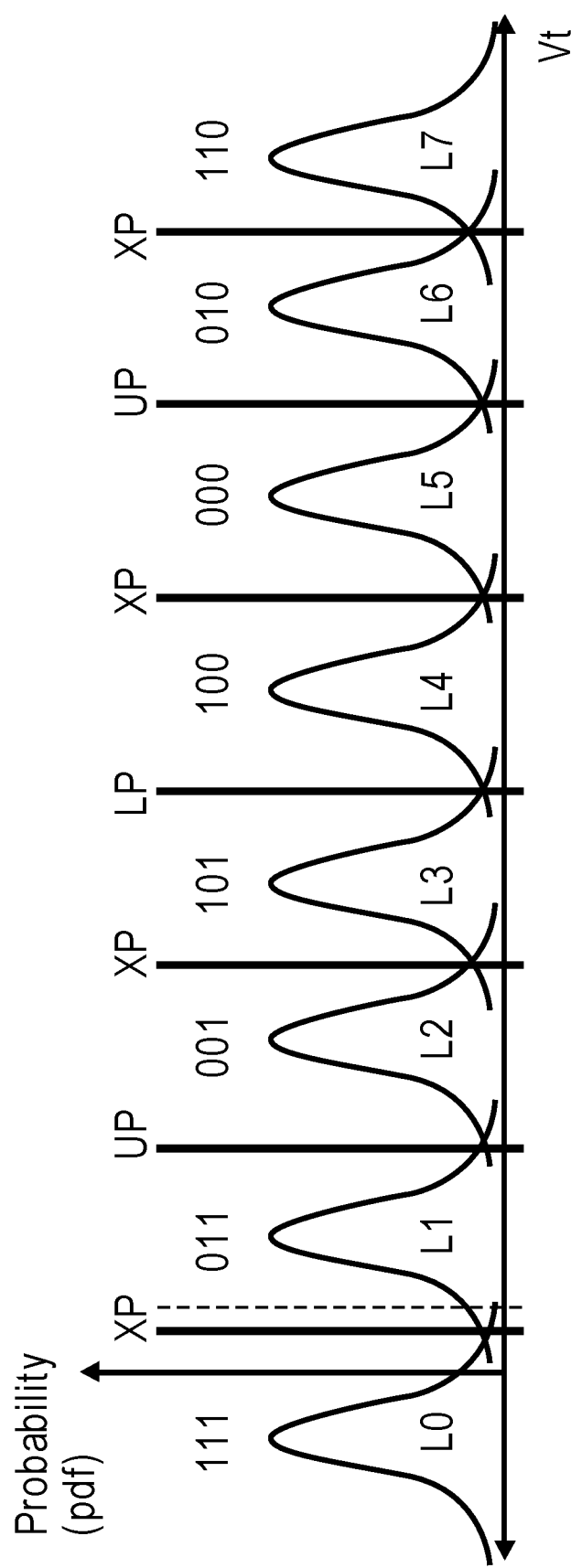
FIG. 2C illustrates an example of a one-sided soft read performed only between L0 and L1.

FIG. 2C also illustrates an example of a one-sided soft read, but with the additional read strobe(s) only between L0 and L1. In one example, a cell may encounter the largest number of errors between the lowest two levels (e.g., level 0 (L0) and level 1 (L1)). In one example, the L0 state can be at a negative voltage, and the voltage distribution may have a tendency to move towards 0V or even go past 0V and continue to become more positive. This effect can be referred to as "program disturb" because programming may use a high voltage, which may move cells towards higher threshold voltages. Program disturb can affect L0 signifi-cantly. Therefore, in one such example, rather than performing soft reads between all neighboring levels, an additional soft read is only performed between L0 and L1. In the example illustrated in FIG. 2C, a single read strobe is performed between all neighboring levels, and only one additional soft read strobe is performed between L0 and L1 (e.g., two read strobes are performed between L0 and L1 instead of a single read strobe). Therefore, in storage devices encountering a high number of errors at the lower levels, a single additional read strobe can enable improvement in error correction without significantly increasing the latency of the read.

FIG. 3 is a flow chart illustrating an example of a method of performing a one-sided soft read. The method 300 can be performed by a controller of a flash storage device. For example, referring to FIG. 4, the method 300 can be performed by the controller 430 and/or access circuitry of the flash storage, which is described in more detail below. The method 300 can be performed by hardware, firmware, software, or a combination.

The method begins with performing a read of a storage cell of a flash storage device at an expected read reference voltage, at operation 302. This read can be referred to as a regular read or a hard read. For example, a controller can apply a read strobe at an expected read reference voltage to one or more storage cells of a storage array, such as storage 422 of FIG. 4. The expected read reference voltage is a voltage that is expected to cause the cell to conduct current in response to the applied read voltage if the cell is programmed to a particular value, and not conduct current in response to the applied read voltage if programmed to a different value. A storage cell typically conducts current if an applied voltage is greater than the threshold voltage of the cell at a given level. For a multi-level cell, the expected read reference voltage is typically a voltage between the expected threshold voltage distributions of two levels. Thus, the controller determines whether the cell conducts current to determine the logic-value of the cell. Note that for simplicity the method 300 describes a single read in operation 302, however, for a multi-level cell, multiple "regular" reads may be performed. For example, referring to FIGS. 2A and 2B, to read the extra page (XP) of a TLC, four read strobes are applied, and to determine all three bits, seven strobes are applied to enable distinguishing between all eight levels.

As mentioned above, threshold voltage distributions at different levels sometimes have tails that approach one another or overlap, which can result in read errors. These errors can be asymmetric (e.g., there can be a tendency to be more zero-to-one or one-to-zero errors). Therefore, the method 300 further involves performing one or more additional reads at voltages on only one side of the expected read reference voltage, at operation 304. For example, referring to FIG. 2B, one additional read strobe is applied to one side of the expected read reference voltages for the XP reads. Whether the additional read strobe is below or above the expected read reference voltage can be based on error information from one or more prior reads, or based on other information such as bulk statistics of the most common error mechanisms or historical data to predict which direction errors are more likely to be skewed towards. In one example, whether an additional read strobe should be applied below or above the expected read reference voltage can be based in part on a program-erase cycle count. Program-erase cycles in flash memory causes wear on the flash cells, so that the distribution of threshold voltages can change based on the number of program-erase cycles that have taken place. Thus, a determination or prediction of whether a one-to-zero or zero-to-one error is more likely can be based on one or more types of information such as the program-erase cycle count, error information from one or more prior reads, statistics, or other information.

In one example, such error information is based on whether more one-to-zero errors or zero-to-one errors occurred in the one or more prior reads. Determining whether more one-to-zero errors or zero-to-one errors occurred can be based on a count of zero-to-one and one-to-zero error bits in codewords from the same page. In another example, a determination of whether more one-to-zero errors or zero-to-one errors occurred is based on a count of zero-to-one and one-to-zero error bits identified in an uncorrectable, partially decoded ECC (error correction code) codeword. Codes such as convolutional codes, turbo codes, and LDPC may provide partially decoded statistics. In one example in which codewords are generated with a code to include a predetermined number of zeros and ones in at least a part of a codeword, a determination of whether more one-to-zero errors or zero-to-one errors occurred is based on a comparison of a number of ones and zeros in a read codeword with the predetermined number of ones and zeros. For example, a balanced code with 50% zeros and ones can be used in the codeword or part of the codeword (or if not 50%, the number or percentage of zeros and ones can be stored and tracked). Then, the number of zeros and ones can be counted and compared to the expected number to determine asymmetry in the one-to-zero or zero-to-one errors. In another example, such as an example in which LDPC is used to generate codewords, an LLR estimation based on the number of satisfied check equations for each variable node can be performed. Based on the LLR estimation, it can be determined whether there is asymmetry in the one-to-zero or zero-to-one errors.

In one example, if the error information indicates more one-to-zero errors, the controller is to perform the one or more reads on a side of the expected read reference voltage closest to a level indicating a logic zero. If the error information indicates more zero-to-one errors, the controller is to perform the one or more reads on a side of the expected read reference voltage closest to a level indicating a logic one. Thus, one or more techniques can be used to determine which side of an expected read reference voltage to perform the one-sided soft read.

After performing one or more additional reads at operation 304, the controller can provide a logic value based on the read and one or more bits of soft information indicating reliability based on the one or more additional reads, at operation 306. The soft information can be referred to as reliability or confidence information, and typically consists of one or more bits providing an indication of how reliable the read logic value is or the likelihood of an error.

Performance of the regular read and the additional read(s) can be performed using different techniques. In one example, the controller on the storage device can issue a single command to the flash component that results in a one-sided soft read (e.g., a one-sided soft read command). In one such example, the one-sided soft read command is a single command that results in two read strobes: the regular read strobe and an additional read strobe on one side of the expected read reference voltage. In one example, more than one command can be used. For example, the controller can issue a two read commands (one regular read command at the expected read reference voltage and a second read command at a voltage that is above or below the expected read reference voltage) and determine the value of the memory cells based on the combination of the result of the two read commands. In both cases, the commands may include information to indicate the read voltage of the read strobe(s). A single soft read command may have lower latency than two separate read commands. For example, if the flash storage component receives a single soft read command, the flash component may perform the two reads very close together in time, whereas if the flash component receives two separate read commands, the flash component may take longer to perform the commands and the ordering of the commands may be different.

It is possible that in some cases a one-sided soft read may still result in uncorrectable errors. For example, if there is a very high rate of errors, if there are an equal or similar number of zero-to-one errors as one-to-zero errors, or both, then a one-sided soft read may still result in uncorrectable errors. In one such example, a controller first attempts to perform a one-sided soft read, and in response to an error that is uncorrectable based on the logic value and information indicating reliability, the controller performs additional reads on the other side of the expected read reference voltage. A regular two-sided soft read can be performed in response to a single uncorrectable error, or a two-sided soft read can become the default read operation after detecting that the number of uncorrectable errors has exceeded a threshold. For example, after an uncorrectable error, the controller can perform a one soft-read at a voltage on the other side of the expected read reference voltage or perform a two-sided soft read. In one example in which the controller or a host-side controller detects that the number of uncorrectable errors has exceeded a threshold, the controller or a host-side controller can program a register (e.g., a mode register) to cause the flash controller to default to two-sided soft reads. Similarly, such a mode register can be programmed to cause the flash controller to perform one-sided soft reads (e.g., by enabling a one-sided soft read mode).

Thus, a method of performing a one-sided soft read can provide improved error correction in many situations without significantly increasing the latency of read operations. The latency improvement can be especially significant for multi-level flash storage cells, or other storage cells in which multiple voltage strobes are applied to read the value stored in the cell. Furthermore, in the event of a high error rate, a flash storage controller can perform two-sided soft reads for additional reliability information.

Figure 4:
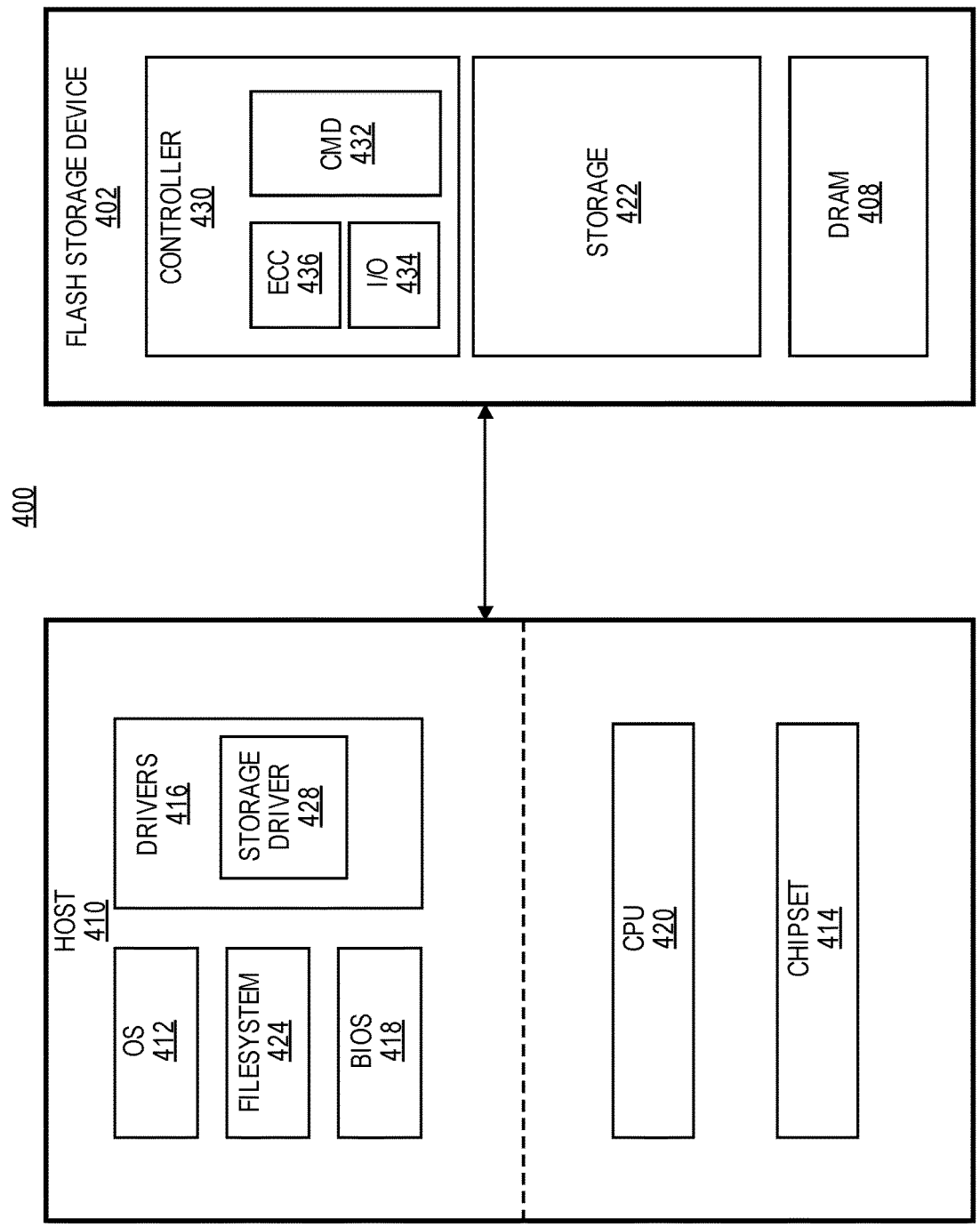
FIG. 4 illustrates an example of a block diagram of a system with a flash storage device in which one-sided soft reads can be implemented.

FIG. 4 illustrates a block diagram of a system with a flash storage device in which a one-sided soft read can be implemented, in accordance with one example. System 400 includes flash storage drive 402 coupled with host 410. Although the term storage is used for device 402 and throughout this disclosure, a flash storage device can also be referred to as a flash memory device. In one example, the flash storage drive 402 is a solid-state drive (SSD).

The host 410 represents a host hardware platform that connects to the flash storage device 402. The host 410 includes a CPU (central processing unit) 420 or other processor(s) as a host processor. The CPU 420 represents any host processor that generates requests to access data stored on the flash storage device 402, either to read the data or to write data to storage 422. Such a processor can include a single or multicore processor, a primary processor for a computing device, a graphics processor, a peripheral processor, or a supplemental or auxiliary processor, or a combination. The host 410 includes chipset 414, which represents hardware components that can control or manage the flow of data between the CPU 420 and other components of the system 400, including the flash storage device 402. For example, the chipset 414 can include interconnect circuits and logic to enable access to the flash storage device 402. In one example, the chipset 414 includes a storage controller, which is a host-side controller that is separate from a controller 430 within the flash storage device 402. Although FIG. 4 illustrates a chipset in the host, which includes logic to control access to the flash storage device, in other examples, the host 410 may not include a chipset, or if it does include a chipset, the storage controller can be independent from the chipset. In one example, the chipset, the storage controller, or both, are integrated with the CPU 420.

The host also includes firmware and software executing on the hardware, such as an operating system 412, a filesystem 424, a basic input/output system (BIOS) 418, drivers 416, and other firmware and software. When the system is powered on, the BIOS 418 is typically responsible for initializing the hardware and loading the operating system 412. The operating system 412 is typically responsible for the management, coordination, and scheduling of activities on the system 400 as well as for the sharing of resources of the system. The filesystem 424 interacts with software, firmware, or both, to access the flash storage device 402. For example, the host 410 can include a storage device driver 428 via which the operating system 412 and the filesystem 424 can access the flash storage device 402. One example of a storage device driver is the Intel® Rapid Storage Technology (RST) driver. Although the system 400 is illustrated as a computer system with a host operating system and a storage device to store data, the system 400 can alternatively include SPI (serial peripheral interface) storage or storage connected to a SPI bus, LSM-based (log-structured-merge-based) key-value solutions, three-dimensional crosspoint memory based solutions, or other storage systems.

In one example, the flash storage device 402 represents a solid state drive that includes nonvolatile storage 422 (which can also be referred to as nonvolatile media (NVM)) for storing data. In one such example, the flash storage device 402 can be a flash based drive connected to a processor using a PCI Express (PCIe), serial advanced technology attachment (ATA), a parallel ATA, and/or a universal serial bus (USB) interface. The storage 422 can include one or more of NAND flash, NOR flash, phase change memory (PCM), phase change memory with switch (PCMS), resistive memory, or other nonvolatile storage media. Data may be stored in single level cell (SLC), triple level cell (TLC), Quad level cell (QLC) and/or multi-level cell (MLC) format. In some examples, the TLC, QLC, and/or MLC cells or blocks are typically used to store user data. The SLC cells or blocks, which generally have faster access speeds at the expense of a reduction in storage density, may not store user data and may not be accessible by the host. In one such example, the SLC cells or blocks can be used by the flash storage device to store "system data" related to the operation of the flash storage device. In other examples, the SLCs could also be used to store user data.

In addition to the nonvolatile storage 422, the flash storage device 402 can also include DRAM 408 (or other volatile memory). The DRAM 408 includes volatile memory that can store data while the flash storage device 402 is powered on (e.g., operational). The DRAM can comply with a standard promulgated by the Joint Electron Device Engineering Council (JEDEC), such as JESD79F for DDR Double Data Rate (DDR) SDRAM, JESD79-2F for DDR2 SDRAM, JESD79-3F for DDR3 SDRAM, JESD79-4A for DDR4 SDRAM, LPDDR3 (low power dual data rate version 3, original release by JEDEC (Joint Electronic Device Engineering Council) JESD209-3B, August 2013 by JEDEC), LPDDR4 (LOW POWER DOUBLE DATA RATE (LPDDR) version 4, JESD209-4, originally published by JEDEC in August 2014, or other JEDEC standards (these standards are available at www.jedec.org). Other volatile memory may be used. Some flash storage devices do not include a DRAM (e.g., "DRAM-less" SSDs). In one such example, the flash storage device can include an SSD controller memory (not shown), such as an SRAM. The DRAM 408 can be used to store data related to the operation of the flash storage device 402, such as a logical-to-physical indirection table or other such information.

The flash storage device 402 also includes a controller 430 to control access to the storage 422. In one example, the controller 430 includes an input/output (I/O) interface 434 to the storage 422 and includes an interface to the host 410. The controller 430 hardware logic to control the writing to storage 422 and reading from storage 422, such as command logic (CMD) 432. The command logic 432 includes circuitry to generate and issue commands to read the storage cells of the storage 422. In one example, the command logic 432 can generate a single command to storage 422 that causes a one-sided soft read (e.g., a one-sided soft read command). In one such example, a single command results in a regular read strobe and one or more additional read strobes on only one side of the regular read strobe. In another example, the command logic 432 can generate separate read commands to cause a one-sided soft read to occur. For example, the command logic 432 can generate one command to perform a read at the expected read reference voltage for a given level, and one or more additional commands above or below the expected read reference voltage. The storage 422 can also include access circuitry to apply strobes to read and write to the storage cells in response to commands from the controller 430. Thus, the storage 422 can include circuitry to decode commands from the command logic 432 (including one or more read commands to perform a one-sided soft read) and apply read or write strobes to the memory cells in accordance with the received commands. The controller can also include error code correction (ECC) logic 436 to detect and correct errors in data read from storage 422. The controller 430 may be an application specific integrated circuit controller (ASIC) device connected to an interface such as a serial ATA or an integrated drive electronics controller. In another example, the controller 430 includes a processor or other processing circuitry (not shown). In one example, the controller 430 may be included in a System-on-a-Chip (SoC) onto a single integrated circuit chip.

The flash storage device 402 can also include firmware (not shown). The firmware can perform a variety of functions such as translation, garbage collection, wear levelling, and other functions for the operation and optimization of flash storage device 402. In one example, the firmware 404 can include the flash translation layer (FTL), which includes logic to provide indirection to identify the physical addresses space for logical addresses such as logical block addresses (LBAs) of requests received from filesystem 424.

The controller can include logic (e.g., hardware, firmware, software, or a combination) to perform one-sided soft reads as described in this disclosure.

Note that although FIG. 4 illustrates an example of a system that may exist within the confines of a computer's package (e.g., within a laptop/notebook or other computer), the storage device 402 may also be accessed via a larger network such as a local area network (e.g., an Ethernet network), or even a wide area network (such as a wireless cellular network, the Internet, etc.).

Figure 5:
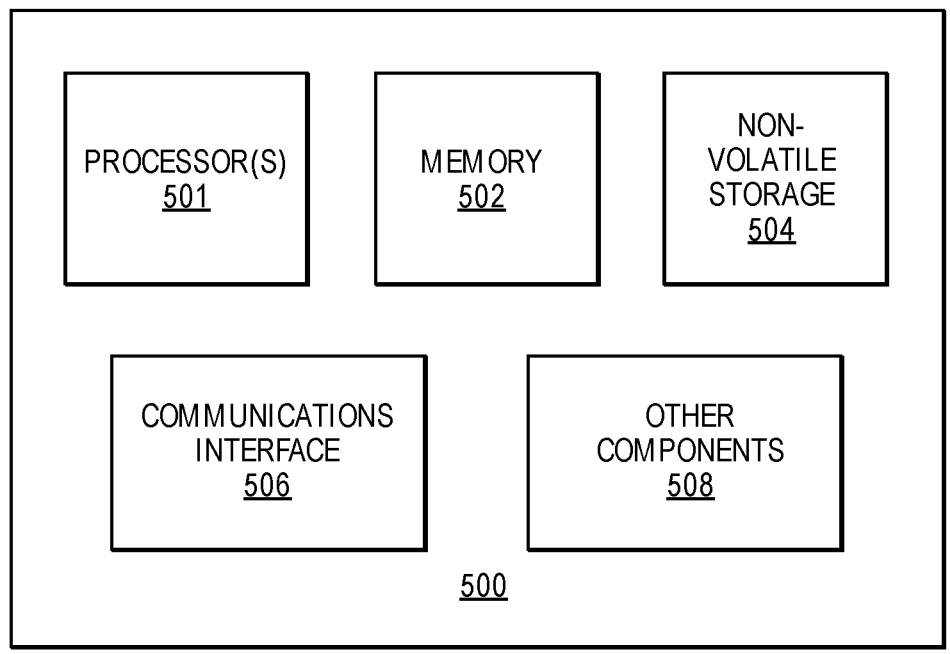
FIG. 5 provides an exemplary depiction of a computing system in which one-sided soft reads can be implemented.

FIG. 5 provides an exemplary depiction of a computing system 500 (e.g., a smartphone, a tablet computer, a laptop computer, a desktop computer, a server computer, etc.). As observed in FIG. 5, the system 500 may include one or more processors or processing units 501. The processor(s) 501 may include one or more central processing units (CPUs), each of which may include, e.g., a plurality of general purpose processing cores. The processor(s) 501 may also or alternatively include one or more graphics processing units (GPUs) or other processing units. The processor(s) 501 may include memory management logic (e.g., a memory controller) and I/O control logic.

The system 500 also includes memory 502 (e.g., system memory), non-volatile storage 504, communications interfaces 506, and other components 508. The other components may include, for example, a display (e.g., touchscreen, flat-panel), a power supply (e.g., a battery or/or other power supply), sensors, power management logic, or other components. The communications interfaces 506 may include logic and/or features to support a communication interface. For these examples, communications interface 506 may include one or more communication interfaces that operate according to various communication protocols or standards to communicate over direct or network communication links or channels. Direct communications may occur via use of communication protocols or standards described in one or more industry standards (including progenies and variants) such as those associated with the PCIe specification. Network communications may occur via use of communication protocols or standards such those described in one or more Ethernet standards promulgated by IEEE. For example, one such Ethernet standard may include IEEE 802.3. Network communication may also occur according to one or more OpenFlow specifications such as the OpenFlow Switch Specification. Other examples of communications interfaces includes, for example, a local wired point-to-point link (e.g., USB) interface, a wireless local area network (e.g., WiFi) interface, a wireless point-to-point link (e.g., Bluetooth) interface, a Global Positioning System interface, and/or other interfaces.

The computing system also includes non-volatile storage 504, which may be the mass storage component of the system. The non-volatile storage 504 can be similar to, or the same as, the flash storage device 402 of FIG. 4, described above. Non-volatile storage 504 may include byte or block addressable types of non-volatile memory having a 3-dimensional (3D) cross-point memory structure that includes chalcogenide phase change material (e.g., chalcogenide glass) hereinafter referred to as "3D cross-point memory". Non-volatile types of memory may also include other types of byte or block addressable non-volatile memory such as, but not limited to, multi-threshold level NAND flash memory, NOR flash memory, single or multi-level phase change memory (PCM), resistive memory, nanowire memory, ferroelectric transistor random access memory (FeTRAM), magnetoresistive random access memory (MRAM) that incorporates memristor technology, spin transfer torque MRAM (STT-MRAM), or a combination of any of the above. In one example, the non-volatile storage 504 may include mass storage that is composed of one or more SSDs. SSDs can be composed of flash memory chips that are capable of implementing one-sided soft reads as described above.

Embodiments of the invention may include various processes as set forth above. The processes may be embodied in machine-executable instructions. The instructions can be used to cause a general-purpose or special-purpose processor to perform certain processes. Alternatively, these processes may be performed by specific/custom hardware components that contain hardwired logic circuitry or programmable logic circuitry (e.g., FPGA, PLD) for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

Examples of methods, systems, and apparatuses for performing a one-sided soft read follow. In one example, a flash storage device includes an array of storage cells and a controller to access the array of storage cells. The controller is to perform at least one read of a storage cell. The flash storage device also includes access circuitry to, in response to the at least one read, apply a read strobe to the storage cell at an expected read reference voltage, and apply one or more read strobes to the storage cell at voltages on only one side of the expected read reference voltage. The controller is to provide a logic value and one or more bits to indicate reliability of the logic value's accuracy based on an electrical response of the storage cell to the read strobe and the one or more read strobes. In one example, the controller is to perform the at least one read to cause the one or more read strobes at voltages on only one side of the expected read reference voltage based on error information from one or more prior reads.

In one example, the controller is to further determine the error information, including to determine whether more one-to-zero errors or zero-to-one errors occurred in the one or more prior reads. In one example, the determination of whether more one-to-zero errors or zero-to-one errors occurred is based on a count of zero-to-one and one-to-zero error bits in codewords from a same page. In one example, a determination of whether more one-to-zero errors or zero-to-one errors occurred is based on a count of zero-to-one and one-to-zero error bits identified in an uncorrectable, partially decoded ECC (error correction code) codeword. In one example, codewords are to be generated with a code to include a predetermined number of zeros and ones in at least a part of a codeword. In one such example, a determination of whether more one-to-zero errors or zero-to-one errors occurred is based on a comparison of a number of ones and zeros in a read codeword with the predetermined number of ones and zeros.

In one example, in response to an error that is uncorrectable based on the logic value and information to indicate reliability, the controller is to perform one or more additional reads to cause application of read strobes on both sides of the expected read reference voltage. In one example, if the error information indicates more one-to-zero errors, the access circuitry is to apply the one or more read strobes at voltages on a side of the expected read reference voltage closest to a level indicating a logic zero, and if the error information indicates more zero-to-one errors, the controller is to apply the one or more read strobes at voltages on a side of the expected read reference voltage closest to a level indicating a logic one. In one example, the array of storage cells includes a NAND flash array including multi-bit storage cells. In one example, the access circuitry is to apply the one or more read strobes between the two lowest levels (L0 and L1) and not apply an additional read strobe on one side of an expected read reference voltage for higher levels.

In one example, a flash storage controller includes command circuitry to perform at least one read of a storage cell, the at least one read to cause application of a read strobe to the storage cell at an expected read reference voltage and application of one or more read strobes to the storage cell at voltages on only one side of the expected read reference voltage, and interface circuitry to transmit read data to a host, the read data including a logic value and one or more bits indicating reliability of the logic value's accuracy based on the storage cell's electrical response to the read strobe and the one or more read strobes. In one example, the command circuitry is to perform the at least one read to cause the one or more read strobes at voltages on only one side of the expected read reference voltage based on error information from one or more prior reads. In one example, the controller is to further determine the error information, including to determine whether more one-to-zero errors or zero-to-one errors occurred in the one or more prior reads. In one example, a determination of whether more one-to-zero errors or zero-to-one errors occurred is based on a count of zero-to-one and one-to-zero error bits in codewords from a same page.

In one example, a method of accessing a flash storage device involves performing at least one read of a storage cell of the flash storage device, the at least one read to cause application of a read strobe to the storage cell at an expected read reference voltage and application of one or more read strobes to the storage cell at voltages on only one side of the expected read reference voltage, and providing a logic value and one or more bits indicating reliability of the logic value's accuracy based on an electrical response of the storage cell to the read strobe and the one or more read strobes. In one example, performing the at least one read to cause the one or more read strobes at voltages on only one side of the expected read reference voltage is based on error information from one or more prior reads.

In one example, the method involves determining the error information, including determining whether more one-to-zero errors or zero-to-one errors occurred in the one or more prior reads. In one such example, determining whether more one-to-zero errors or zero-to-one errors occurred involves counting zero-to-one and one-to-zero error bits in codewords from a same page. In one example, determining whether more one-to-zero errors or zero-to-one errors occurred involves counting zero-to-one and one-to-zero error bits identified in an uncorrectable, partially decoded ECC (error correction code) codeword. In one example, codewords are generated with a code to include a predetermined number of zeros and ones in at least a part of a codeword, and determining whether more one-to-zero errors or zero-to-one errors occurred involves comparing a number of ones and zeros in a read codeword with the predetermined number of ones and zeros.

In one example, the method involves, in response to an error that is uncorrectable based on the logic value and information indicating reliability, performing one or more additional reads to cause application of read strobes at voltages on both sides of the expected read reference voltage. In one example, performing the at least one read involves applying read strobes between multiple levels of a multi-bit storage cell, and the one or more read strobes are to be applied between the two lowest levels (L0 and L1) without application of additional read strobes on one side of an expected read reference voltage for higher levels. In one example, at least one non-transitory machine readable medium having stored thereon one or more instructions that, when executed by a computing device, causes the computing device to perform a method including: performing at least one read of a storage cell of the flash storage device, the at least one read to cause application of a read strobe to the storage cell at an expected read reference voltage and application of one or more read strobes to the storage cell at voltages on only one side of the expected read reference voltage, and providing a logic value and one or more bits indicating reliability of the logic value's accuracy based on an electrical response of the storage cell to the read strobe and the one or more read strobes. In one example, a system includes a processor, and a flash storage device in accordance with one or more examples described herein. In one example, a flash storage device includes an array of storage cells, and means to apply a read strobe to the storage cell at an expected read reference voltage, apply one or more read strobes to the storage cell at voltages on only one side of the expected read reference voltage, and provide a logic value and one or more bits to indicate reliability of the logic value's accuracy based on an electrical response of the storage cell to the read strobe and the one or more read strobes.

Flow diagrams as illustrated herein provide examples of sequences of various process actions. The flow diagrams can indicate operations to be executed by a software or firmware routine, as well as physical operations. In one example, a flow diagram can illustrate the state of a finite state machine (FSM), which can be implemented in hardware, software, or a combination. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various examples; thus, not all actions are required in every embodiment. Other process flows are possible.

To the extent various operations or functions are described herein, they can be described or defined as software code, instructions, configuration, data, or a combination. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters or sending signals, or both, to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A flash storage device comprising:
an array of storage cells; and
a controller to access the array of storage cells, the controller to perform at least one read of a storage cell;
access circuitry to, in response to the at least one read:
apply a read strobe to the storage cell at an expected read reference voltage, and
perform a soft read including application of one or more read strobes to the storage cell only at voltages either less than or greater than the expected read reference voltage based on error information from one or more prior reads,
wherein if the error information indicates more one-to-zero errors in the one or more prior reads, the access circuitry is to apply the one or more read strobes at voltages to be closest to a level indicating a logic zero, and
if the error information indicates more zero-to-one errors in the one or more prior reads, the access circuitry is to apply the one or more read strobes at voltages to be closest to a level indicating a logic one; and
the controller to provide a logic value and one or more bits to indicate reliability of the logic value's accuracy based on an electrical response of the storage cell to the read strobe and the one or more read strobes.

2. The flash storage device of claim 1, wherein the controller is to further:
determine the error information, including to determine whether more one-to-zero errors or zero-to-one errors occurred in the one or more prior reads.

3. The flash storage device of claim 2, wherein:
the determination of whether more one-to-zero errors or zero-to-one errors occurred in the one or more prior reads is based on a count of zero-to-one and one-to-zero error bits in codewords from a same page.

4. The flash storage device of claim 2, wherein:
a determination of whether more one-to-zero errors or zero-to-one errors occurred in the one or more prior reads is based on a count of zero-to-one and one-to-zero error bits identified in a partially decoded ECC (error correction code) codeword accessed by the one or more prior reads.

5. The flash storage device of claim 2, wherein:
codewords are to be generated with a code to include a predetermined number of zeros and ones in at least a part of a codeword; and
wherein a determination of whether more one-to-zero errors or zero-to-one errors occurred in the one or more prior reads is based on a comparison of a number of ones and zeros in a codeword accessed by the one or more prior reads.

6. The flash storage device of claim 1, further comprising:
in response to an error that is uncorrectable based on the logic value and information to indicate reliability, the controller is to perform a second soft read including application of one or more read strobes to the storage cell at voltages less than and greater than the expected read reference voltage.

7. The flash storage device of claim 1, wherein:
the array of storage cells comprises a NAND flash array including multi-bit storage cells.

8. The flash storage device of claim 7, wherein:
the access circuitry is to apply the one or more read strobes between the two lowest levels (L0 and L1) and not apply an additional read strobe for higher levels.

9. A flash storage controller comprising:
command circuitry to perform at least one read of a storage cell, the at least one read to cause: application of a read strobe to the storage cell at an expected read reference voltage and performance of a soft read including application of one or more read strobes to the storage cell only at voltages either less than or greater than the expected read reference voltage based on error information from one or more prior reads,
wherein if the error information indicates more one-to-zero errors in the one or more prior reads, the command circuitry is to apply the one or more read strobes at voltages to be closest to a level indicating a logic zero, and
if the error information indicates more zero-to-one errors in the one or more prior reads, the command circuitry is to apply the one or more read strobes at voltages to be closest to a level indicating a logic one; and
interface circuitry to transmit read data to a host, the read data including a logic value and one or more bits indicating reliability of the logic value's accuracy based on the storage cell's electrical response to the read strobe and the one or more read strobes.

10. The flash storage controller of claim 9, wherein the command circuitry is to further:
determine the error information, including to determine whether more one-to-zero errors or zero-to-one errors occurred in the one or more prior reads.

11. The flash storage controller of claim 9, wherein:
a determination of whether more one-to-zero errors or zero-to-one errors occurred in the one or more prior reads is based on a count of zero-to-one and one-to-zero error bits in codewords from a same page.

12. The flash storage controller of claim 9, wherein:
the determination of whether more one-to-zero errors or zero-to-one errors occurred in the one or more prior reads is based on a count of zero-to-one and one-to-zero error bits identified in a partially decoded ECC (error correction code) codeword accessed by the one or more prior reads.

13. The flash storage controller of claim 9, wherein:
codewords are to be generated with a code to include a predetermined number of zeros and ones in at least a part of a codeword; and
wherein a determination of whether more one-to-zero errors or zero-to-one errors occurred in the one or more prior reads is based on a comparison of a number of ones and zeros in a codeword accessed by the one or more prior reads.

14. The flash storage controller of claim 9, further comprising:
in response to an error that is uncorrectable based on the logic value and information indicating reliability, the command circuitry is to perform a second soft read including application of one or more read strobes to the storage cell at voltages less than and greater than the expected read reference voltage.

15. The flash storage controller of claim 9, wherein:
the one or more read strobes are to be applied between the two lowest levels (L0 and L1) without application of an additional read strobe for higher levels.

16. A system comprising:
a processor; and
a flash storage device including:
an array of storage cells;
a controller to access the array of storage cells, the controller to perform at least one read of a storage cell;
access circuitry to, in response to the at least one read:
apply a read strobe to the storage cell at an expected read reference voltage, and
perform a soft read including application of one or more read strobes to the storage cell at voltages either less than or greater than the expected read reference voltage based on error information from one or more prior reads,
wherein if the error information indicates more one-to-zero errors in the one or more prior reads, the access circuitry is to apply the one or more read strobes at voltages to be closest to a level indicating a logic zero, and
if the error information indicates more zero-to-one errors in the one or more prior reads, the access circuitry is to apply the one or more read strobes at voltages to be closest to a level indicating a logic one; and
the controller to provide a logic value and one or more bits to indicate reliability of the logic value's accuracy based on an electrical response of the storage cell to the read strobe and the one or more read strobes.

17. The system of claim 16, wherein the controller is to further:
determine the error information, including to determine whether more one-to-zero errors or zero-to-one errors occurred in the one or more prior reads based on a count of zero-to-one and one-to-zero error bits in codewords from a same page.

* * * * *